(12) United States Patent
Kim et al.

(10) Patent No.: US 10,658,300 B2
(45) Date of Patent: May 19, 2020

(54) SEMICONDUCTOR PACKAGE AND SEMICONDUCTOR DEVICE INCLUDING THE SAME

(71) Applicant: SAMSUNG ELECTRONICS CO., LTD., Suwon-si, Gyeonggi-Do (KR)

(72) Inventors: Young-Lyong Kim, Anyang-si (KR); Seung-Duk Baek, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/102,391

(22) Filed: Aug. 13, 2018

(65) Prior Publication Data
US 2019/0221520 A1 Jul. 18, 2019

(30) Foreign Application Priority Data
Jan. 17, 2018 (KR) .......................... 10-2018-0006274

(51) Int. Cl.
*H01L 23/538* (2006.01)
*H01L 25/065* (2006.01)
*H01L 23/00* (2006.01)
*H01L 25/00* (2006.01)

(52) U.S. Cl.
CPC ...... *H01L 23/5384* (2013.01); *H01L 23/5385* (2013.01); *H01L 23/5386* (2013.01); *H01L 24/14* (2013.01); *H01L 25/0657* (2013.01); *H01L 25/50* (2013.01); *H01L 2225/06513* (2013.01); *H01L 2225/06517* (2013.01); *H01L 2225/06541* (2013.01); *H01L 2225/06548* (2013.01)

(58) Field of Classification Search
CPC ..... H01L 2224/171; H01L 2224/17104; H01L 2224/1712; H01L 24/14; H01L 24/81; H01L 23/5384; H01L 23/5385; H01L 23/5386; H01L 25/0657
USPC ................ 257/774, 737, 773, 777, E25.013; 438/109, 613, 612
See application file for complete search history.

(56) References Cited

U.S. PATENT DOCUMENTS

| | | | |
|---|---|---|---|
| 5,587,342 A | 12/1996 | Lin et al. | |
| 5,620,132 A | 4/1997 | Downing et al. | |
| 5,816,482 A | 10/1998 | Grabbe | |
| 6,245,598 B1 | 6/2001 | Chen et al. | |
| 6,297,078 B1 | 10/2001 | Barrow | |

(Continued)

FOREIGN PATENT DOCUMENTS

| | | |
|---|---|---|
| KR | 101025349 | 3/2011 |
| KR | 1020140020507 | 2/2014 |

*Primary Examiner* — Mohammed Shamsuzzaman
*Assistant Examiner* — Aaron J Gray
(74) *Attorney, Agent, or Firm* — Volentine, Whitt & Francos, PLLC

(57) ABSTRACT

A semiconductor package includes a lower chip, an upper chip on the lower chip, and an adhesive layer between the lower chip and the upper chip. The lower chip has first through silicon vias (TSVs) and pads on an upper surface thereof. The pads are connected to the first TSVs, respectively. The upper chip includes bumps on a lower surface thereof. The bumps are bonded to the pads. Vertical centerlines of the bumps are aligned with vertical centerlines of the first TSVs, respectively. The vertical centerlines of the bumps are offset from the vertical centerlines of the pads, respectively, in a peripheral region of the lower chip.

18 Claims, 7 Drawing Sheets

(56) References Cited

U.S. PATENT DOCUMENTS

| | | |
|---|---|---|
| 6,413,850 B1 | 7/2002 | Ooroku et al. |
| 6,420,651 B1 | 7/2002 | Barrow |
| 6,429,515 B1 | 8/2002 | Glenn |
| 6,583,385 B1 | 6/2003 | Sinkunas et al. |
| 6,710,434 B1 | 3/2004 | Bai |
| 6,729,532 B2 | 5/2004 | Inoue et al. |
| 6,833,615 B2 | 12/2004 | Geng et al. |
| 7,213,330 B2 | 5/2007 | Caldwell et al. |
| 7,633,144 B1 | 12/2009 | Kim et al. |
| 7,642,639 B2 | 1/2010 | Huang et al. |
| 7,896,223 B2 | 3/2011 | Honma et al. |
| 8,129,849 B1 | 3/2012 | Kim et al. |
| 8,703,541 B2 | 4/2014 | Choi et al. |
| 9,129,849 B2 | 9/2015 | Lee |
| 2005/0151228 A1* | 7/2005 | Tanida ............... H01L 21/76843 257/620 |
| 2005/0253245 A1 | 11/2005 | Lynch et al. |
| 2005/0282374 A1* | 12/2005 | Hwang ............... H01L 21/6835 438/613 |
| 2009/0149023 A1* | 6/2009 | Koyanagi ......... H01L 21/76898 438/666 |
| 2012/0018863 A1* | 1/2012 | Oganesian ........ H01L 21/76898 257/676 |
| 2014/0191234 A1* | 7/2014 | Huang .................... H01L 22/32 257/48 |
| 2015/0318261 A1* | 11/2015 | Chung ............. H01L 21/76898 257/774 |

* cited by examiner

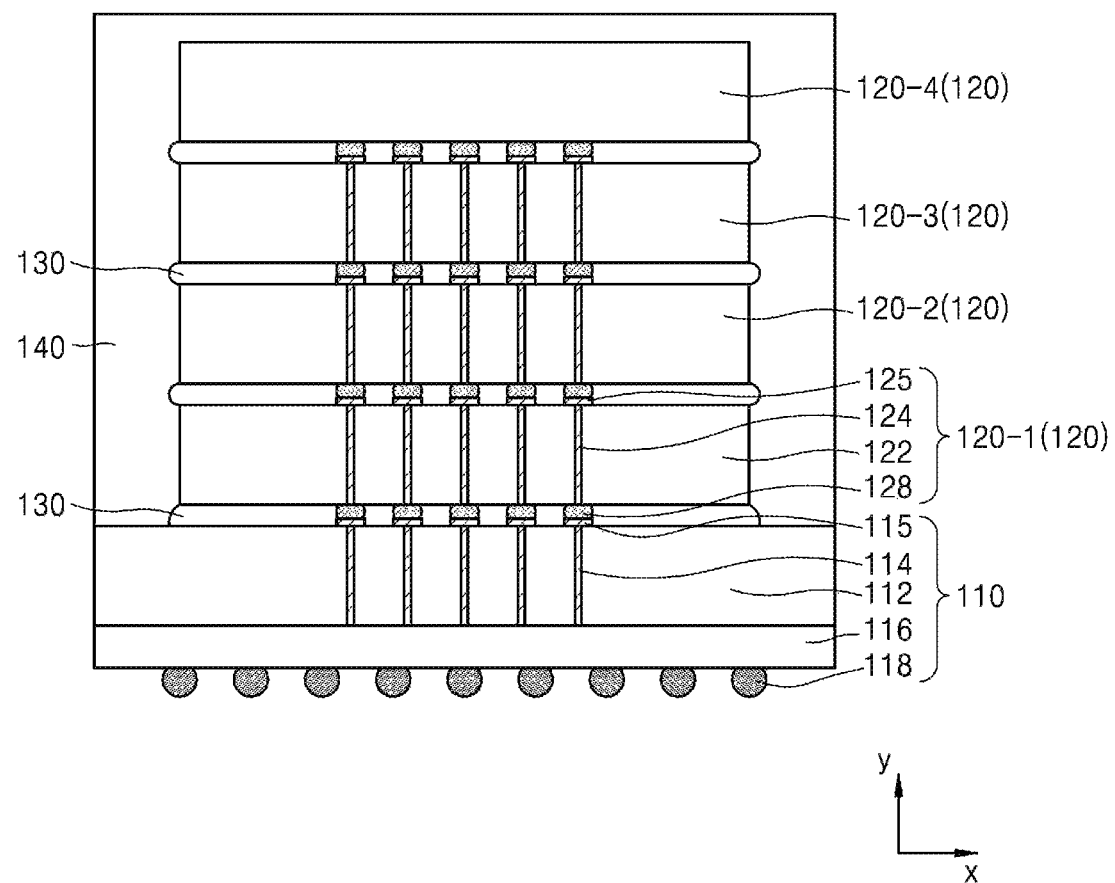

SEMICONDUCTOR PACKAGE AND SEMICONDUCTOR DEVICE INCLUDING THE SAME

PRIORITY STATEMENT

This application claims priority under 35 U.S.C. § 119 to Korean Patent Application No. 10-2018-0006274, filed on Jan. 17, 2018, in the Korean Intellectual Property Office, the disclosure of which is hereby incorporated by reference in its entirety.

BACKGROUND

1. Technical Field

The inventive concept relates to a semiconductor package, and more specifically, to a semiconductor package including a through silicon via (TSV).

2. Discussion of Related Art

With the evolution of the electronics industry, electronic devices are becoming increasing miniaturized and lighter. To meet this trend, a small, light, high performance, high density, and high reliability semiconductor package is required. In this regard, a semiconductor chip including a through silicon via (TSV) and a semiconductor package including the same have been studied.

SUMMARY

According to the inventive concept, there is provided a semiconductor package including a lower chip including a lower chip body, first through silicon vias (TSVs) extending vertically through the lower chip body, and pads on an upper surface of the lower chip body, the pads being electrically connected to the first TSVs, respectively, an upper chip on the lower chip, the upper chip including an upper chip body, and bumps on a lower surface of the upper chip body, the bumps directly bonded to corresponding ones of the pads of the lower chip, respectively, and each of the bumps including a pillar and a solder layer, and an adhesive layer between the lower chip body and the upper chip body. Each of the pillars of the bumps, the first TSVs and the pads has a centerline extending in a direction perpendicular to the upper surface of the lower chip body. The centerlines of the pillars of the bumps extend through geometric centers of the pillars, respectively, as viewed in a plan view of the semiconductor package, the centerlines of the first TSVs extend through axial centers of the first TSVs, respectively, and the centerlines of the pads extend vertically through geometric centers of the pads, respectively, as viewed in a plan view of the semiconductor package. The centerlines of the pillars of the bumps are aligned with the centerlines of the first TSVs, respectively. And, in a peripheral region of the lower chip, the centerline of the pillar of a bump is offset from the centerline of the corresponding one of the pads to which the bump is bonded.

According to the inventive concept, there is also provided a semiconductor package including a buffer chip and a first memory chip on the buffer chip. The buffer chip may include first through silicon vias (TSVs) therein and first pads on an upper surface thereof. The first pads may be connected to the first TSVs, respectively. The first memory chip may include bumps on a lower surface thereof. The bumps may be bonded to the first pads. Each of the bumps may include a pillar and a solder layer. First centerlines of the pillars of the bumps may be aligned with second centerlines of the first TSVs, respectively. The first centerlines of the pillars of the bumps may be misaligned with third centerlines of the first pads, respectively, in a peripheral region of the buffer chip. The first centerlines, the second centerlines, and the third centerlines may be directed along a vertical direction perpendicular to the upper surface of the buffer chip.

According to the inventive concept, there is also provided a semiconductor device including a printed circuit board (PCB), an interposer mounted on the PCB, a high bandwidth (HBM) package mounted on the interposer, and a processor chip mounted on the interposer. The processor chip may be spaced apart from the HBM package. The HBM package may include a buffer chip a first memory chip on the buffer chip. The buffer chip may include first through silicon vias (TSVs) therein and first pads on an upper surface thereof. The first pads may be connected to the first TSVs, respectively. The first memory chip may include first bumps on a lower surface thereof. The first bumps may be bonded to the first pads. Each of the first bumps may include a pillar and a solder layer. First centerlines of the pillars of the first bumps may be aligned with second centerlines of the first TSVs, respectively. The first centerlines of the pillars of the bumps may be misaligned with third centerlines of the first pads, respectively, in a peripheral region of the buffer chip. The first centerlines, the second centerlines, and the third centerlines may be directed along a vertical direction perpendicular to the upper surface of the buffer chip.

According to the inventive concept, there is also provided a semiconductor device including a printed circuit board (PCB), an interposer mounted on the PCB, the interposer including an interposer body, through-vias extending vertically through the interposer body, and pads disposed on and electrically connected to the through-vias, respectively, a high bandwidth (HBM) package mounted on the interposer and comprising a buffer chip and a memory chip on the buffer chip, the buffer chip including a buffer chip body, first TSVs electrically connected to the memory chip and extending vertically through the buffer chip body, and bumps on a lower surface of the buffer chip body, the bumps being electrically connected to the first TSVs, respectively, a processor chip mounted on the interposer as laterally spaced apart from the HBM package, the processor chip including a processor chip body and bumps on a lower surface of the processor chip body, and an adhesive layer interposed between the HBM package and the interposer and between the processor chip and the interposer. The bumps are bonded to corresponding ones of the pads of the interposer, respectively, each of the bumps including a pillar and a solder layer. Each of the pillars of the bumps and the pads of the interposer has a centerline extending in a direction perpendicular to an upper surface of the interposer body. The centerlines of the pillars of the bumps extend through geometric centers of the pillars, respectively, as viewed in a plan view of the semiconductor device. The centerlines of the pads of the interposer extend vertically through geometric centers of the pads of the interposer, respectively, as viewed in a plan view of the semiconductor device. Furthermore, in a peripheral region of an interface between the buffer chip and the interposer, the centerline of the pillar of a bump of the buffer chip is offset from the centerline of the corresponding one of the pads of the interposer to which the bump is bonded for each of a plurality of the bumps and the corresponding ones of the pads bonded to each other. And in a peripheral region of an interface between the processor chip and the interposer, the centerline of the pillar of a bump is offset from the centerline of the corresponding one of the pads of the interposer to which the bump is bonded.

According to the inventive concept, there is also provided a semiconductor package or device including a substrate having a substrate body, through-vias extending vertically through the substrate body, and pads on an upper surface of the substrate body, the pads being disposed on and electrically connected to the through-vias, respectively, a chip comprising an integrated circuit on the substrate, the chip including a chip body, and bumps on a lower surface of the chip body, the bumps electrically connected to the integrated circuit and directly bonded to corresponding ones of the pads, respectively, and each of the bumps including a pillar and a solder layer, and an adhesive layer between the substrate body and the chip body. Each of the pillars of the bumps and the through-vias has a centerline extending in a direction perpendicular to the upper surface of the substrate body. The centerlines of the pillars of the bumps extend through geometric centers of the pillars, respectively, as viewed in a plan view of the semiconductor package or device, the centerlines of the through-vias coincide with axial centers of the through-vias, respectively, and the centerlines of the pillars of the bumps are aligned with the centerlines of the through-vias, respectively. Also, for each of the pads in a peripheral region of the substrate, one part of the pad closer to a peripheral edge of the substrate has a surface is greater than that of a remainder of the pad closer to a central region of the substrate. Here, the one part of the pad and the remainder of the pad are on opposite sides of the centerline of the through-via on which the pad is disposed, along an outer direction extending from the central region of the substrate to the peripheral edge of the substrate, such that the pad is asymmetrical with respect to the centerline of the through-via on which the pad is disposed.

BRIEF DESCRIPTION OF THE DRAWINGS

FIG. 1 is a cross-sectional view of an example of a semiconductor package according to the inventive concept.

DETAILED DESCRIPTION

Figure 2A:
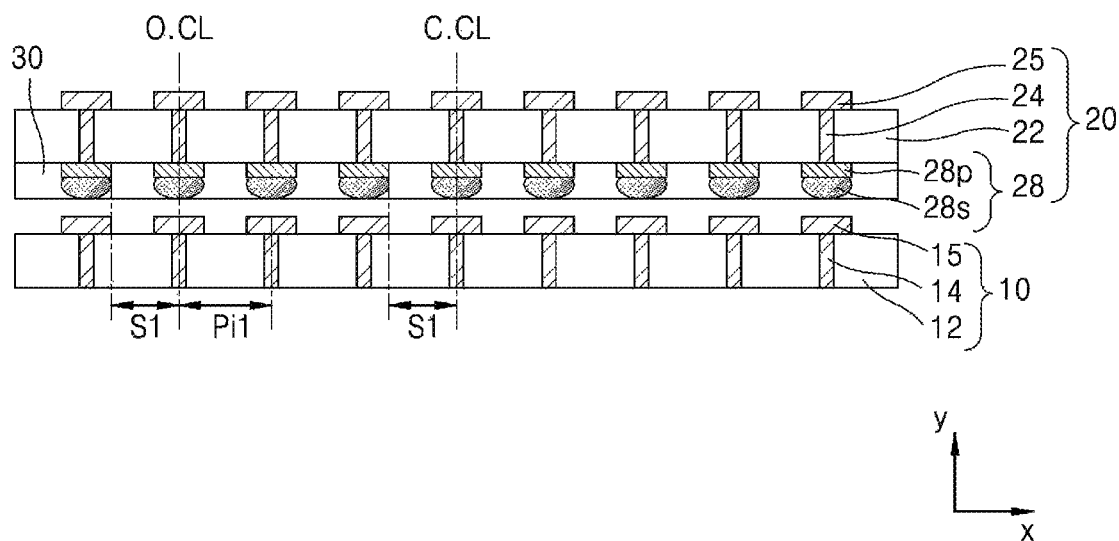
FIGS. 2A and 2B are cross-sectional views of a chip stack illustrating a solder sweeping phenomenon generated in a process of stacking semiconductor chips through a thermal compression bonding (TCB) method.

Various examples of the inventive concept will now be described more fully hereinafter with reference to the accompanying drawings. Like reference numerals designate like elements throughout the drawings and thus such elements may be described only once in the detailed description that follows.

FIG. 1 is a cross-sectional view of an example of a semiconductor package according to the inventive concept.

Referring to FIG. 1, the semiconductor package 100 includes a base chip 110, a chip stack 120, an adhesive layer 130, and an encapsulant 140.

The base chip 110 may constitute the lowermost layer of the semiconductor package 100. The base chip 110 may have a size, namely, a footprint, larger than that of each of semiconductor chips 120-1~120-4 in the chip stack 120. In some examples, the size of the base chip 110 is the same as that of each of the semiconductor chips 120-1~120-4.

The base chip 110 includes a substrate 112, through silicon vias (TSVs) 114, pads 115, a device layer 116, and bumps 118.

The substrate 112 may include a semiconductor material, e.g., silicon or germanium. The substrate 112 may include a compound semiconductor, e.g., silicon carbide (SiC), gallium arsenide (GaAs), indium arsenide (InAs), or indium phosphide (InP). The substrate 112 may be a silicon on insulator (SOI) substrate. For example, the substrate 112 may include a buried oxide (BOX) layer. The substrate 112 may include a conductive region, e.g., an impurity-doped well or an impurity-doped structure. The substrate 112 may include various isolation structures, e.g., a shallow trench isolation (STI) structure.

The TSVs 114 may extend through the substrate 112 from an upper surface thereof to a lower surface thereof. The TSVs 114 may extend into the device layer 116. Each of the TSVs 114 may have a column shape and include a barrier layer and a buried conductive layer surrounded by the barrier layer. The barrier layer may include, for example, Ti, TiN, Ta, TaN, Ru, Co, Mn, WN, Ni, and/or NiB. The buried conductive layer may include, for example, Cu, Cu alloy (e.g., CuSn, CuMg, CuNi, CuZn, CuPd, CuAu, CuRe, or CuW), W, W alloy, Ru, Ni, and/or Co. A via insulation layer may be interposed between the TSVs 114 and the device layer 116 and/or between the TSVs 114 and the substrate 112. The via insulation layer may include, for example, oxide, nitride, carbon, polymer, or a combination thereof.

The pads 115 may be disposed on the upper surface of the substrate 112 to be connected to the TSVs, respectively. Each of the pads 115 may have a flat circular plate shape. In some examples, each of the pads 115 has an elliptical or polygonal plate shape. In some examples, each of the pads 115 has a substantial vertical dimension or height, i.e., may be columnar. A protection insulation layer (not shown) may be disposed on the upper surface of the substrate 112, and the TSVs 114 may extend through the protection insulation layer. Thus, the pads 115 may be disposed on the TSVs 114 and the protection insulation layer. Each of the pads 115 may include, or example, Al, Cu, Ni, W, Pt, and/or Au.

In the semiconductor package 100, at least some of the pads 115 may respectively be arranged to be misaligned with (or shifted with respect to) corresponding ones of the TSVs 114 thereunder. To connect the misaligned pads 115 to the corresponding TSVs 114, each of the misaligned pads 115 and each of the corresponding TSVs 114 may be partly overlapped with each other. For example, centerlines of at least some of the pads 115, which are directed along a first direction (the vertical direction y in the figure perpendicular to the upper surface of the base chip 110), may respectively be shifted from (misaligned with) centerlines of the corresponding TSVs 114 which are directed along the first direction y. For example, a centerline of each of the pads 115 disposed in a peripheral region of the base chip 110 may be spaced apart from a centerline of each of the corresponding TSVs 114 in an outer direction (e.g., a direction from the center of the base chip 110 toward a side edge thereof).

When a first semiconductor chip 120-1 is stacked on the base chip 110 through bumps 128, centerlines of the bumps 128 in the first direction y may respectively be aligned with the centerlines of the corresponding TSVs 114 in the first direction y. Thus, the centerlines of the shifted pads 115 may respectively be offset from the centerlines of the corresponding bumps 128. A condition in which each pad 115 is laterally offset from each TSV 114 or each bump 128 will be described in detail with reference to FIGS. 4A, 4B, and 5 to 7.

The device layer 116 may include devices of various types according to kinds of chips. The device layer 116 may include an active device and/or a passive device, e.g., a field effect transistor (FET), such as a planar FET or a FinFET, a memory, such as a flash memory, a dynamic random access memory (DRAM), a static random access memory (SRAM), an electrically erasable programmable read-only memory (EEPROM), a phase change random access memory (PRAM), a magnetoresistive random access memory (MRAM), a ferroelectric random access memory (FeRAM), or a resistive random access memory (ReRAM), a logic gate, such as an AND, OR, or NOT gate, a system large scale integration (LSI), a CMOS images sensor, or a microelectro-mechanical system (MEMS).

The base chip 110 may include a plurality of logic devices in the device layer 116. Thus, the base chip 110 may be what is referred to in the art as a logic chip. The base chip 110 disposed below the chip stack 120 may transmit signals output from the semiconductor chips 120-1~120-4 to an outer device and transmit signals input from the outer device or power to the semiconductor chips 120-1~120-4. Thus, the base chip 110 may be what is referred to in the art as a buffer chip or a controller chip. The semiconductor chips 120-1~120-4 of the chip stack 120 may include a plurality of memory devices. Thus, the semiconductor chips 120-1~120-4 may be memory chips or core chips.

In some examples, the base chip 110 may include a plurality of memory devices in the device layer 116. Thus, the base chip 110 may be a memory chip.

The device layer 116 may include a wiring structure that electrically connects at least two devices, the devices and the conductive region in the substrate 112, or the devices and outer connection terminals, e.g., the bumps 118. The wiring structure may include, for example, a wiring line and/or a contact. The wiring structure may electrically connect the TSVs 114 and the bumps 118.

The device layer 116 may be disposed below the TSVs 114, but the inventive concept is not limited thereto. In some examples, the device layer 116 is disposed on the TSVs 114. For example, a location relationship between the device layer 116 and the TSVs 114 may be relative to each other.

The bumps 118 may be disposed on a lower surface of the base chip 110 and be electrically connected to the TSVs 114 through the wiring structure of the device layer 116. Lower pads (not shown) may be disposed on the lower surface of the base chip 110, and the bumps 118 may be disposed on the lower pads, respectively. Each of the bumps 118 may include a pillar (see 118p of FIG. 9) and a solder layer (see 118s of FIG. 9).

The pillar (see 118p of FIG. 9) may have a circular column shape and include, for example, Ni, Cu, Pd, Pt, Au, or a combination thereof. In some examples, a diffusion barrier layer and/or a bonding layer may be disposed between the pillar (see 118p of FIG. 9) and the solder layer (see 118s of FIG. 9). The diffusion barrier layer may include, for example, Ni, Co, Cu, or a combination thereof. The bonding layer may include, for example, Ni, Cu, Co, Pt, Au, or a combination thereof.

The solder layer (see 118s of FIG. 9) may be disposed on the pillar (see 118p of FIG. 9) and have a spherical or ball shape. The solder layer (see 118s of FIG. 9) may include, for example, Sn, In, Bi, Sb, Cu, Ag, Zn, Pb, or a combination thereof. For example, the solder layer (see 118s of FIG. 9) may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn. In some examples, an intermediate layer is disposed at a contact interface between the solder layer (see 118s of FIG. 9) and the pillar (see 118p of FIG. 9). The intermediate layer may include an intermetallic compound that is formed by a reaction between metal materials of the solder layer (see 118s of FIG. 9) and the pillar (see 118p of FIG. 9), at a relatively high temperature.

The chip stack 120 may be stacked on the base chip 110, and include at least one semiconductor chip. The chip stack 120 may include four semiconductor chips, i.e., first, second, third, and fourth semiconductor chips 120-1, 120-2, 120-3, and 120-4. However, the semiconductor chips in the chip stack 120 is not limited to any particular number of chips. For example, the chip stack 120 may include two to thirty two semiconductor chips.

The semiconductor chips 120-1~120-4 in the chip stack 120 may each have a structure similar to the base chip 110. For example, the first semiconductor chip 120-1 may include a substrate body 122, TSVs 124, pads 125, and the bumps 128. The substrate body 122 may include a substrate and a device layer. The TSVs 124 may extend through the substrate body 122. For example, the first semiconductor chip 120-1 may include a cell region and a pad region. In this case, the TSVs 124 may be disposed in the pad region and extend through the substrate body 122.

The device layer of the first semiconductor chip 120-1 may include a plurality of memory devices. For example, the device layer may include a volatile memory device, such as DRAM or SRAM, or a non-volatile memory device, such as PRAM, MRAM, FeRAM, or ReRAM. Each of the semiconductor chips 120-1~120-4 may be a high bandwidth memory (HBM) chip including DRAM devices. Thus, the semiconductor package 100 may be an HBM package.

The TSVs 124 and the pads 125 may be similar to the TSVs 114 and the pads 115 of the base chip 110. The bumps 128 may be similar to the bumps 118. The offset between the pads 125 and the bumps 128 or the TSVs 124 may be the same as the offset between the pads 115 and the bumps 128 or the TSVs 114, described above. The fourth semiconductor chip 120-4 disposed at the uppermost layer of the chip stack 120 may not include TSVs and pads.

The adhesive layer 130 may be interposed between the base chip 110 and the first semiconductor chip 120-1 and between adjacent ones of the semiconductor chips 120-1~120-4, and surround sidewalls of the bumps 128. The adhesive layer 130 may protrude outward from sidewalls of the semiconductor chips 120-1~120-4. The adhesive layer 130 may include, for example, a non-conductive film (NCF). When, in a process of stacking the semiconductor chip, the semiconductor chip is bonded by a thermal compression bonding (TCB) method, the NCF may be used as an adhesive. In this case, the NCF may flow, and thus the solder layer of each of the bumps 128 may be swept. A solder sweeping phenomenon caused by the fluidity of the NCF will be described in detail with reference to FIGS. 2A, 2B, and 3.

The encapsulant 140 may cover sidewalls of the chip stack 120 and sidewalls of the adhesive layer 130. The encapsulant 140 may have a predetermined thickness and cover an upper surface of the fourth semiconductor chip 120-4. In some examples, the encapsulant 140 does not cover the upper surface of fourth semiconductor such that the upper surface of the fourth semiconductor chip 120-4 is exposed. The encapsulant 140 may include an epoxy mold compound (EMC), but is not limited thereto.

In the semiconductor package 100 according to example examples, the centerlines of at least some of the pads 115 and 125 may respectively be offset from the centerlines of the corresponding TSVs 114 and 124. The centerlines of the pads 115 and 125 that are in the peripheral region of the base chip 110 or the semiconductor chips 120-1~120-4 may respectively be misaligned with (or offset from) the centerlines of the corresponding TSVs 114 and 124, or the corresponding bumps 128 in the outer direction (e.g., the direction from the center of the base chip 110 or each of the semiconductor chips 120-1~120-4 toward the side edge thereof). Thus, when the semiconductor chip is stacked through the TCB method, the bonding between each of the pads 115 and 125 and each of the bumps 128 may be rigidly maintained despite the fluidity of the NCF and the solder sweeping caused thereby, such that the short circuit and the contact failure may be prevented or reduced. Therefore, the reliability of the semiconductor package 100 may be improved.

Figure 2B:
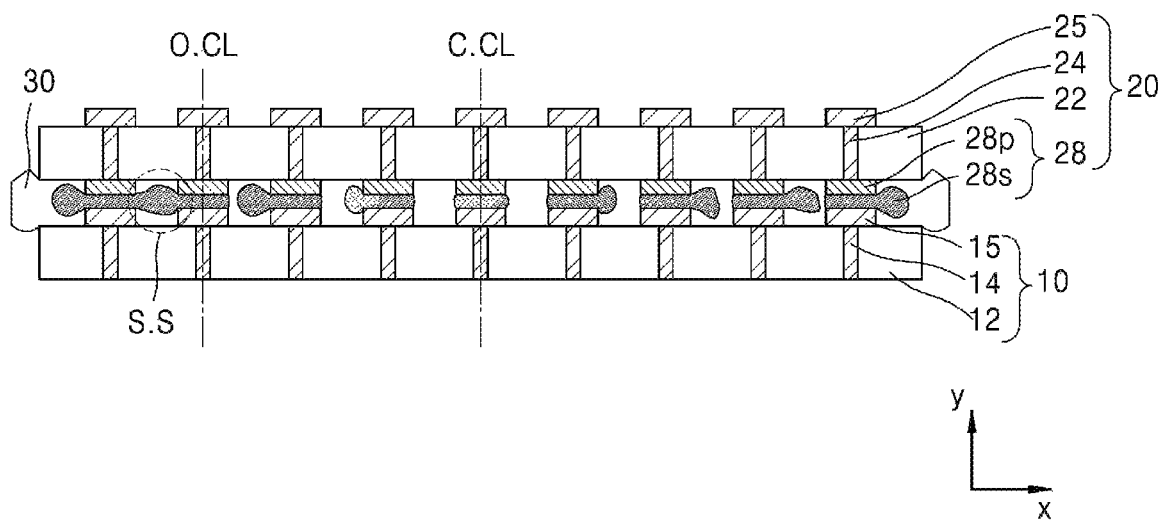
Figure 3:
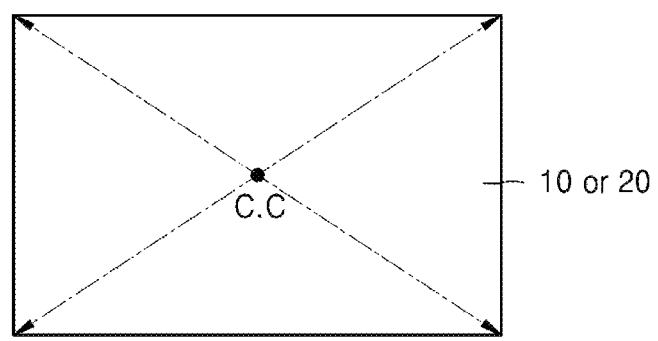
FIG. 3 is a conceptual diagram illustrating a flowing direction of a non-conductive film (NCF) in a process of stacking semiconductor chips through a TCB method.

FIGS. 2A and 2B illustrate a solder sweeping phenomenon generated in a process of stacking semiconductor chips through a thermal compression bonding (TCB) method. FIG. 2A illustrates an alignment state of an upper chip and a lower chip before the process of stacking the semiconductor chips. FIG. 2B illustrates a state in which the upper chip has been stacked on the lower chip through the TCB method. FIG. 3 is a conceptual view illustrating a flowing direction of a non-conductive film (NCF) in a process of stacking semiconductor chips through a TCB method. Elements as described with reference to FIG. 1 will not be described again in detail or will only be briefly mentioned.

Referring to FIGS. 2A, 2B and 3, in a lower chip 10, centerlines of pads 15 may be respectively aligned with centerlines of the TSVs 14. For example, a centerline C.CL may pass through the center of a center pad of the pads 15 and the center of the corresponding TSV 14 in the first direction y. A centerline O.CL may also pass through the center of a peripheral pad of the pads 15 and the center of the correspond TSV 14 in the first direction y. In the case of the lower chip 10, a substrate body 12 is illustrated, but bumps below the substrate body 12 are not illustrated. The substrate body 12 may include a substrate and a device layer.

In the upper chip 20, centerlines of the pads 25 may be respectively aligned with centerlines of the TSVs 24. Centerlines of bumps 28 may be respectively aligned with centerlines of the TSVs 24. In the upper chip 20, the substrate body 22 may include a substrate and a device layer. Each of the bumps 28 may include a pillar 28p and a solder layer 28s. An adhesive layer 30 may be disposed on a lower surface of the upper chip 20 to cover sidewalls of the bumps 28. In some examples, the adhesive layer 30 covers lower surfaces and the sidewalls of the bumps 28. The adhesive layer 30 may be, for example, an NCF.

The pads 15 and the TSVs 14 of the lower chip 10 and the pads 25 and the TSVs 24 of the upper chip 20 may arranged at the same first pitch Pi1. For example, a distance in a second direction x between the centerline of any one of the pads 15 and another pad 15 adjacent thereto may be the same at a center region and a peripheral region of the lower chip 10. For example, a first distance S1 in the second direction x between the centerline C.CL of the pad 15 in the center region of the lower chip 10 and another pad 15 adjacent thereto may be the same as a distance in the second direction x between the centerline O.CL of the pad 15 in the peripheral region of the lower chip 10 and another pad 15 adjacent thereto, as designated by S1 in FIG. 2A. A width of each of the pads 15 and 25 in the second direction x may correspond to half the pitch of the pads 15 and 25, but is not limited thereto. That is, the width of each of the pads 15 and 25 in the second direction x may be greater or less than half the pitch of the pads 15 and 25. The second direction x is a horizontal direction parallel to an upper surface of the lower chip 10 and perpendicular to the first direction y.

When the upper chip 20 is stacked on the lower chip 10 through the TCP method, each of the bumps 28 of the upper chip 20 and each of the pads 15 of the lower chip 10 may be vertically aligned with each other. That is, the centerlines of the TSVs 14 of the lower chip 10 may be respectively aligned with the centerlines of the bumps 28 of the upper chip 20. However, the relative location of the solder layer 28s of the bump 28 is not fixed due to its fluidity. Thus, the centerline of each of the bumps 28 is defined herein as the centerline of the pillar 28p.

The TCB method may be performed to bond the upper chip 20 to the lower chip 10 at a predetermined pressure and at a high temperature, e.g., 200 to 300° C., such that the bumps of the upper chip 20 may be bonded to the pads 15 of the lower chip 10. During the bonding process using such a TCB method, the adhesive layer 30 and the solder layer 28s may be melted to have fluidity. As shown by the arrows in FIG. 3, in the bonding process using the TCB method, the adhesive layer 30 may flow from the center C.C of the lower chip 10 or the upper chip 20 toward a perimeter or an edge thereof in a radial direction. Additionally, since the solder layer 28s has the fluidity, a solder sweeping phenomenon may occur in which the flow of the adhesive layer 30 causes the solder layer 28s to flow toward the perimeter or an outer side edge of the lower chip 10 or the upper chip 20.

If the bonding process using the TCB method were performed without the adhesive layer 30, the solder layer 28s would tend to only flow symmetrically around the corresponding pad 15, i.e., the solder swing phenomenon does not occur. However, if the bonding process using the TCB method were performed without the adhesive layer 30, a bonding force between the lower chip 10 and the upper chip 20 would be so weak that the lower chip 10 and the upper chip 20 would likely separate from each other due to warpage of the semiconductor package. Thus, the semiconductor package would be unreliable. Accordingly, an adhesive layer 30, such as the NCF, is typically provided between the upper chip 20 and the lower chip 10. However, as described above, in the bonding process through the TCB method, the solder sweeping phenomenon may be caused due to the fluidity of the adhesive layer 30, and the TCB method may give rise to a sweeping phenomenon that is potentially the cause of a short circuit or contact failure.

As shown in FIG. 2B, in the bonding process using the TCB method, the solder sweeping phenomenon is exacerbated in the peripheral region of the upper chip 20 or lower chip 10. That is, a relatively large amount of the solder layer 28s flows in the peripheral region of the upper chip 20 or lower chip 10, thus generating a short circuit S.S, between adjacent solder layers 28s as in the region illustrated in FIG. 2B in the dotted circle. In the case in which an excessive amount of the solder layer 28s flows off a pad due to the solder sweeping phenomenon, an insufficient amount of the solder layer 28s may remain against the corresponding pad 15, such that a contact failure is generated.

Figure 4A:
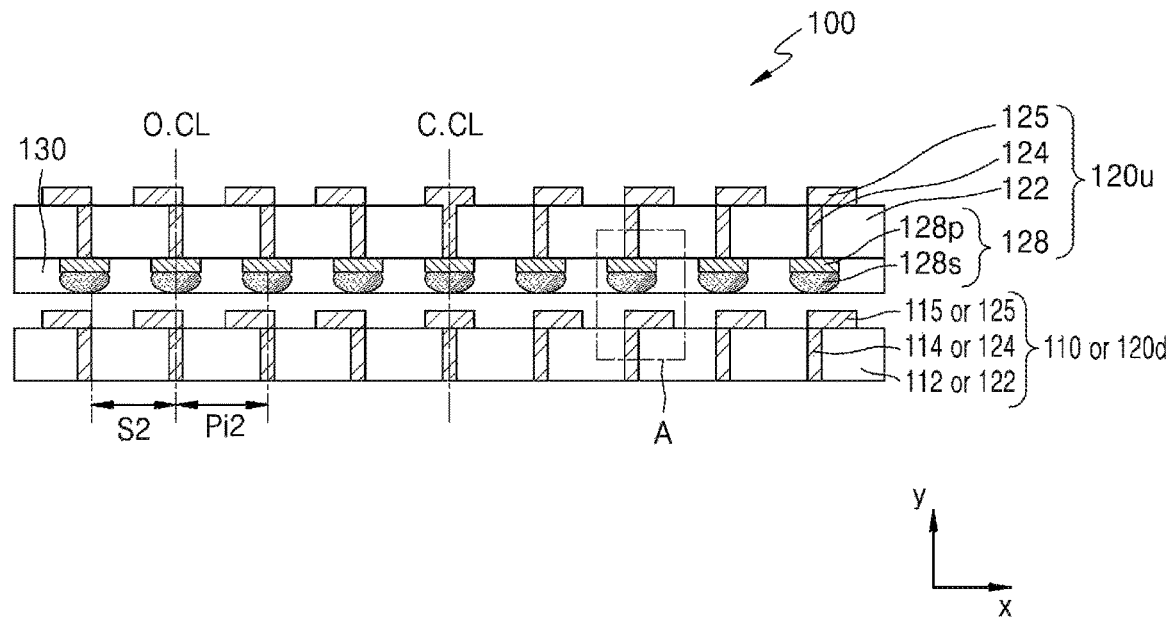
FIG. 4A is a cross-sectional view of a portion of the semiconductor package of FIG. 1, illustrating an alignment state of an upper chip and a lower chip before stacking the upper chip on the lower chip.
Figure 4B:
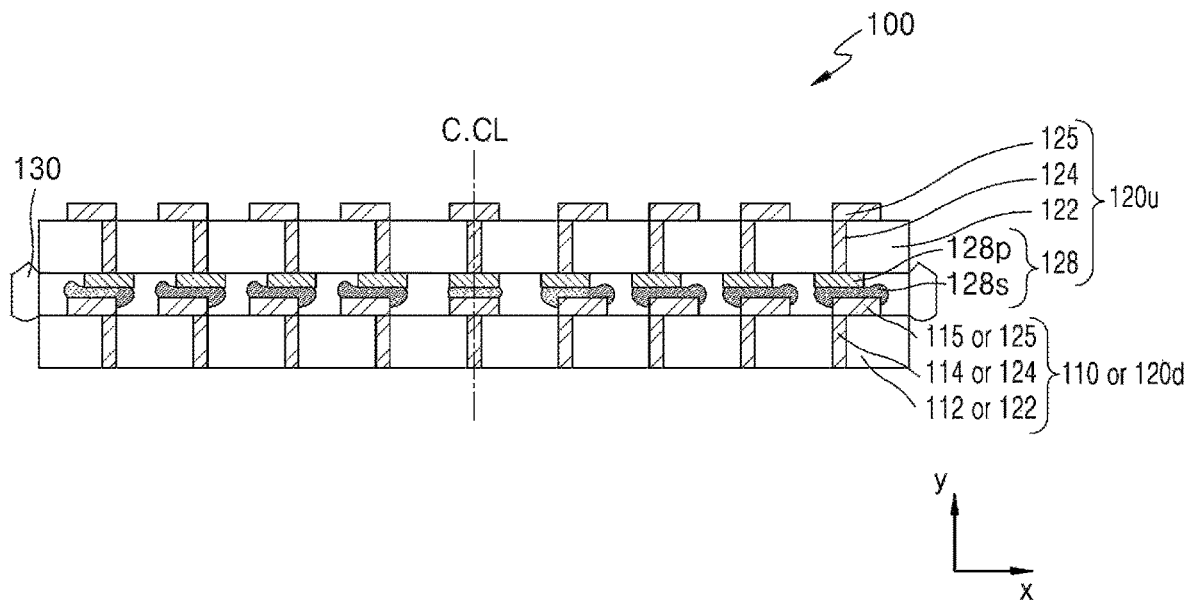
FIG. 4B is a cross-sectional view of a portion of the semiconductor package of FIG. 1, illustrating a state in which an upper chip is stacked on a lower chip through a TCB method.

FIG. 4A is a cross-sectional view of a portion of the semiconductor package of FIG. 1, illustrating an alignment state of an upper chip and a lower chip before stacking the upper chip on the lower chip. FIG. 4B is a cross-sectional view of a portion of the semiconductor package of FIG. 1, illustrating a state in which an upper chip is stacked on a lower chip through a TCB method.

Referring to FIGS. 4A and 4B, a lower chip 110 or 120d may be the base chip 110 of the semiconductor package 100 of FIG. 1 or any one of the first to third semiconductor chips 120-1~102-3 of the semiconductor package 100 of FIG. 1. Bumps in the lower chip 110 or 120d are not illustrated in the drawings, for clarity. A substrate body 112 or 122 may include a substrate and a device layer.

An upper chip 120u may be any one of the first to fourth semiconductor chips 120-1~120-4 of the semiconductor package 100 of FIG. 1 If the upper chip 120u is the fourth semiconductor chip 120-4, the upper chip 120u may not include the TSVs 124 and the pads 125. The bumps 128 may be disposed on a lower surface of the upper chip 120u. Each of the bumps 128 may include the pillar 128p and the solder layer 128s. The adhesive layer 130 may be disposed on the lower surface of the upper chip 120u. The adhesive layer 130 may cover the bumps 128.

The pads 115 or 125 may be offset in an outer direction (e.g., a direction from the center of the lower chip 110 or 120d or the upper chip 120u toward a side edge thereof) with respect to the corresponding TSVs 114 or 124, except for the pad 115 or 125 at the center of the lower chip 110 or 120d or the upper chip 120u. Instead, the pad 115 or 125 at the center of the lower chip 110 or 120d is disposed symmetrically with respect to the corresponding TSV 114 or 124. Thus, the TSV 114 or 124 at the center of the lower chip 110 or 120d, the corresponding pad 115 or 125, and the corresponding bump 128 of the upper chip 120u may have the same centerline C.CL. However, each pad 115 or 125 in a peripheral region of the lower chip 110 or 120d may be offset in the outer direction relative to the centerline O.CL of the corresponding TSV 114 or 124. The TSV 114 or 124 in the peripheral region of the lower chip 110 or 120d may vertically aligned with, i.e., have the same centerline O.CL as, the corresponding bump 128 of the upper chip 120u.

As the pad 115 or 125 in the peripheral region of the lower chip 110 or 120d is arranged as shifted in the outer direction relative to the centerline O.CL, the bump 128 corresponding to the pad 115 or 125 may be spaced in the outer direction far apart from the adjacent pad 115 or 125. More specifically, as described with reference to FIG. 2A, in the peripheral region of the lower chip 10, the distance between the centerline O.CL of the bump 128 and a proximal end of the pad 15 adjacent thereto was denoted as the first distance S1. However, as shown in FIG. 4A, in the peripheral region of the lower chip 110 or 120d, the distance between the centerline O.CL of the bump 128 and a proximal end of the pad 115 or 125 adjacent thereto in the outer direction is a second distance S2 greater than the first distance S1. This difference is caused owing to the fact that the pads 115 or 125 are disposed shifted in the outer direction except for the center pad 115 or 125, while the bumps 128 and the TSVs 114 or 124 are disposed at the same pitch in the center region and the peripheral region. The difference between the first distance S1 and the second distance S2 may correspond to the extent to which the centerline of the pad 115 or 125 is shifted in the outer direction from the centerline of the corresponding TSV 114 or 124.

In examples of the semiconductor package 100 according to the inventive concept, the bumps 128 and the TSVs 114 or 124 may be arranged at the same second pitch Pi2 across the whole region. The second pitch Pi2 may be substantially equal to the first pitch Pi1 of FIG. 2A. A distance between the centerlines of the adjacent pads 115 or 125 in the center region may be different from a distance between the centerlines of the adjacent pads 115 or 125 in the peripheral region. For example, the distance between the centerline of the center pad 115 or 125 and the centerline of the adjacent pad 115 or 125 may be greater than the distance between the centerlines of the adjacent pads 115 or 125 in the peripheral region. Thus, the pads 115 or 125 may not have a set pitch because the distances between adjacent ones of the pads 115 or 125 are different. However, because the pads 115 and 125 have the above-mentioned shift when compared to the arrangement shown in FIG. 2A, except for the center pad 115 or 125, the pads 115 or 125 other than the center pad 115 or 125 may have the second pitch Pi2.

A width of each of the pads 115 or 125 may correspond to half the pitch, e.g., half the second pitch Pi2, of the TSVs 114 or 124, but the inventive concept is not limited thereto.

When the upper chip 120u is stacked on the lower chip 110 or 120d having the aforementioned pad arrangement structure through the TCB method, the adhesive layer 130, e.g., the NCF, may flow, and thus the solder layer 128s may be swept. However, because the pads 115 or 125 of the lower chip 110 or 120d have the above-described offset in the outer direction, the solder layer 128s flowing in the outer direction due to the solder sweeping phenomenon may be sufficiently accommodated on the pads 115 and 125. In addition, a wetting force of the solder layer 128s on the pads 115 or 125 may act as a reverse force with respect to the solder sweeping, thus suppressing the solder sweeping phenomenon. Therefore, contact failure between the pad 115 or 125 and the bump 128 may be reduced or prevented. Furthermore, because the end of the peripheral pad 115 or 125 is spaced relatively far from the centerline of the adjacent bump 128, compared to the structure in which the pad 15 is arranged aligned with the TSV 14 as shown in FIG. 2A, a short circuit between the adjacent solder layers 128s may be prevented. Furthermore, the relative increase in the distance between the pad 115 or 125 and the bump 128 that are adjacent to each other in the outer direction may result in reduction of the pitch of the TSVs 114 or 124 or the pads 115 or 125.

Figure 5:
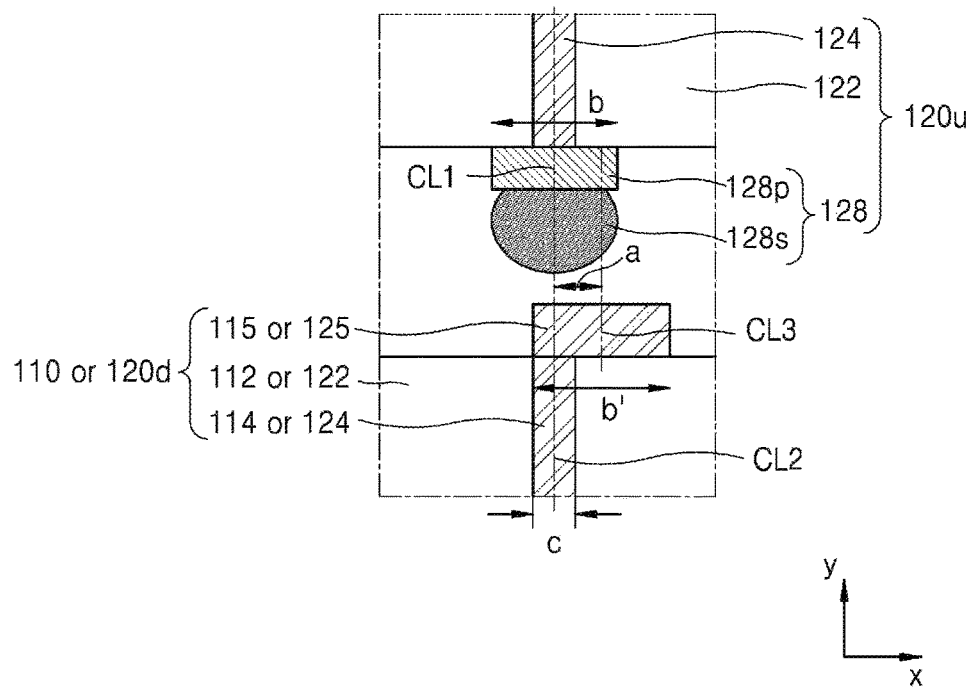
FIG. 5 is an enlarged view of portion A of FIG. 4A, illustrating an alignment state of a bump of the upper chip and a TSV and a pad of the lower chip.

FIG. 5 is an enlarged view of portion A of FIG. 4A, illustrating an alignment state of a bump of the upper chip and a TSV and a pad of the lower chip.

Referring to FIG. 5, reference character CL1 denotes the centerline of the TSV 124 and the bump 128 of the upper chip 120u. Reference character CL2 denotes the centerline of the TSV 114 or 124 of the lower chip 110 or 120d. Reference character CL3 denotes the centerline of the pad 115 or 125 of the lower chip 110 or 120d. The centerlines extend in the first direction y. In addition, reference character "b" denotes a width of the bump 128 (e.g., a width of the pillar 128P) in the second direction x, reference character "b'" denotes a width of the pad 115 or 125 in the second direction x, and reference character "a" denotes a distance between the CL2 and the CL3.

For each of the pads 115 or 125 in a peripheral region (of the substrate 112 or 122) of the lower chip 110 or 120d, one part of the pad 115 or 125 closer to a peripheral region has a surface area greater than that of the remainder of the pad closer to a central region (of the substrate 112 or 122) of the lower chip 110 or 120d. Here, the one part of the pad 115 or 125 and the remainder of the pad 115 or 125 are on opposite sides of the centerline CL2 of the TSV 114 or 124 on which the pad 115 or 125 is disposed, along the outer direction ("x" direction in the figure) extending from the central region to the peripheral edge, such that the pad 115 or 125 is asymmetrical with respect to the centerline CL2 of the TSV on which the pad 115 or 125 is disposed.

The bump 128 and the pad 115 or 125 may have a horizontal cross section that is circular. In this case, the dimensions b and the b' refer to the diameter. In other examples, the bump 128 and the pad 115 or 125 have a horizontal cross section that is rectangular, elliptical, or polygonal. The centerlines Cl1 and Cl3 of the bumps 128 (pillars 128p) and pads 115 or 125 thus pass through the geometric centers of the bumps 128 (pillars 128p) and pads 115 or 125, respectively, as viewed in a plan view. In the semiconductor package 100, the dimensions b and the b' may be substantially equal to each other. In other examples, the dimension b may be greater than b', or the dimension b' may be greater than b.

In the semiconductor package 100, a misalignment amount (or shifted extent) (MA) of the pad 115 or 125 may be proportional to the distance between the centerline CL2 and the centerline CL3. The MA of the pad 115 or 125 may be expressed by the following equation (1):

$$MA = a/b \qquad (1)$$

In the semiconductor package 100, the MA of the pad 115 or 125 may be up to 50%. In the process of stacking the upper chip 120u through the TCB method, the MA of the pad 115 or 125 may be set less than or equal to 50% to reduce or prevent the contact failure. If the MA of the pad 115 or 125 were to exceed 50%, an overlapping area between the solder layer 128s of the bump 128 and the pad 115 or 125 would be minimal, such that the solder layer 128s would mostly contact the substrate body 112 or 122 instead of the pad 115 or 125 at the beginning of the stacking process. Thus, by the solder sweeping, a large amount of the solder layer 128s would be left on the substrate body 112 or 122 and a small amount of the solder layer 128s would be left on the pad 115 or 125.

Referring to FIGS. 4A and 4B, the MAs of most of the pads 115 or 125 may be substantially the same except for the center pad 115 or 125 in the center region of the lower chip 110 or 120d. However, the inventive concept is not limited to MAs being substantially the same for the pads 115 or 125. For example, the Mas of the pads 115 or 125 disposed on the lower chip 110 or 120d may vary. Hereinafter, an example of how the MAs of the pads 115 or 125 may vary are described with reference to FIGS. 6 and 7.

Figure 6:
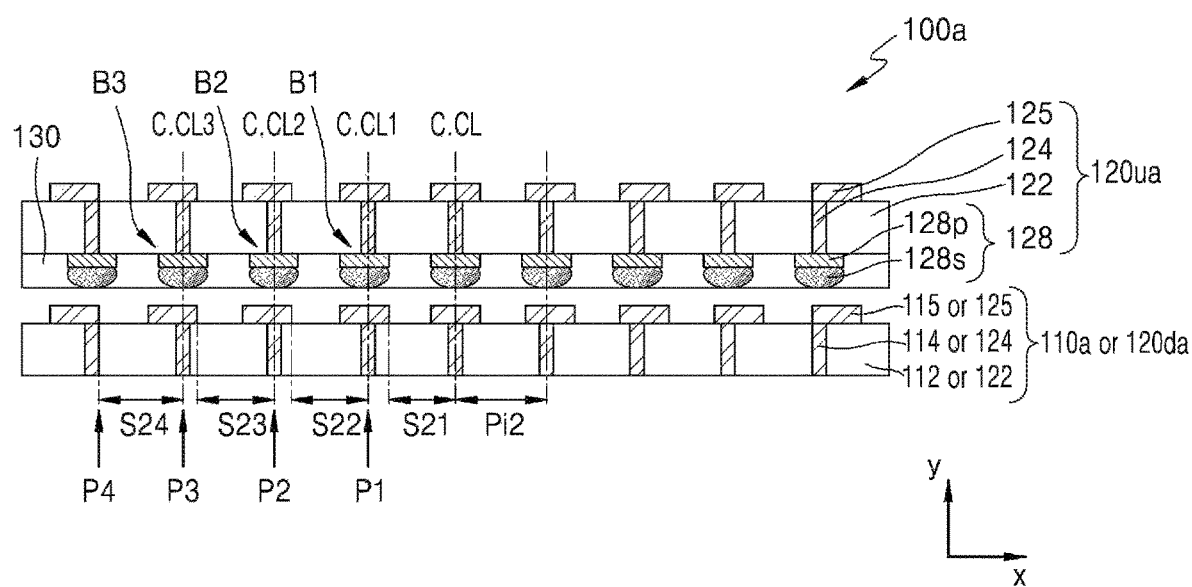
FIGS. 6 and 7 are cross-sectional views of a semiconductor package according to examples, corresponding to FIG. 4A.
Figure 7:
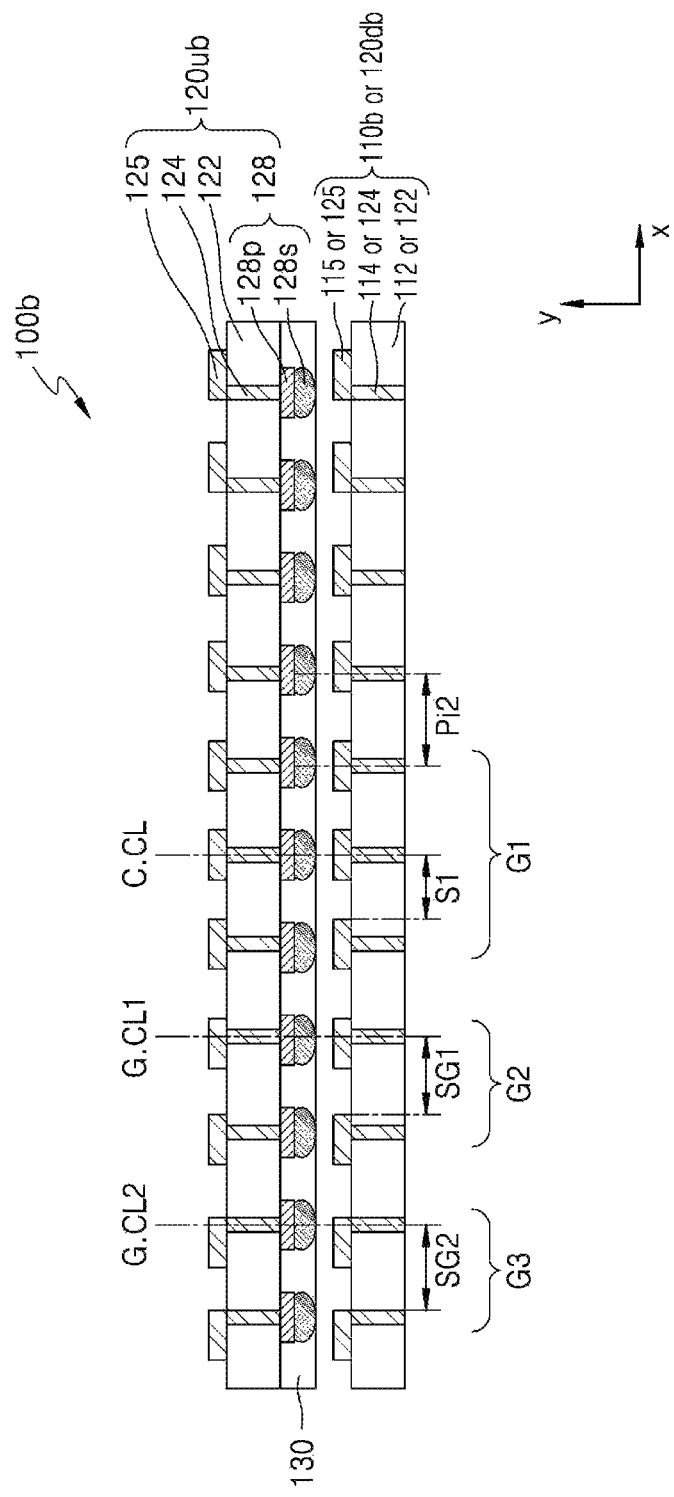

FIGS. 6 and 7 illustrate an example of a semiconductor package according to the inventive concept. The same elements as described with reference to FIGS. 1 to 5 will not be described again in detail or only briefly mentioned.

Referring to FIG. 6 showing the pre-stacked state of semiconductor package 100a according to the inventive concept, this examples is different from the semiconductor package of FIG. 4A in terms of the MA of the pads 115 or 125 in a peripheral region of a lower chip 110a or 120da. For example, in the semiconductor package 100a, the MA of the pad 115 or 125 may be 0% in a center region of the lower chip 110a or 120da and increase in an outer direction (e.g., a direction from the center of the lower chip 110a or 120da toward a side edge thereof). For example, in the center region of the lower chip 110a or 120da, the TSV 114 or 124, the pad 115 or 125, and the bump 128 may have substantially the same centerline C.CL. In other words, in the center region of the lower chip 110a or 120da, the pad 115 or 125 may be vertically aligned with the corresponding TSV 114 or 124.

The MA of the pad 115 or 125 at a first position P1 in the outer direction from the center pad 115 or 125 may be 10%. The MA of the pad 115 or 125 at a second position P2 in the outer direction from the center pad 115 or 125 may be 20%. The MA of the pad 115 or 125 at a third position P3 in the outer direction from the center pad 115 or 125 may be 30%. The MA of the pad 115 or 125 at a fourth position P4 in the outer direction from the center pad 115 or 125 may be 40%. However, the MAs of the pads 115 or 125 are not limited to such amounts and relative increases. In addition, the MAs of the pads 115 or 125 and/or the increase in the MAs of the pads 115 or 125 may have symmetry, e.g., point-symmetry or line-symmetry, with respect to the center pad 115 or 125 of the lower chip 110a or 120da.

As the MAs of the pads 115 or 125 vary, the distance between the bump 128 and the pad 115 or 125 adjacent thereto may increase in the outer direction. For example, a distance between the centerline C.CL of the center bump 128 in the center region and an end of the pad 115 or 125 at the first position P1 may be a first distance S21, a distance between a centerline C.CL1 of a first bump B1 adjacent to the center bump 128 and an end of the pad 115 or 125 at the second position P2 adjacent thereto may be a second distance S22, a distance between a centerline C.CL2 of a second bump B2 and an end of the pad 115 or 125 at the third position P3 adjacent thereto may be a third distance S23, and a distance between a centerline C.CL3 of a third bump B3 and an end of the pad 115 or 125 at the fourth position P4 adjacent thereto may be a fourth distance S24. The first distance S21, the second distance S22, the third distance S23, and the fourth distance S24 increase in the foregoing order.

In a process of stacking an upper chip 120ua through the TCB method, the fluidity of the adhesive layer 130 and the solder sweeping may increase in the outer direction. Therefore, the MAs of the pads 115 or 125 may be set and varied in dependence on a magnitude of the fluidity of the adhesive layer 130 in the semiconductor package 100a. For example, to appropriately cope with the magnitude of the solder sweeping, the MA of the pad 115 or 125 near to the center region, in which the solder sweeping occurs less, may be relatively small, and the MA of the pad 115 or 125 that is farther away from the center region may be relatively large. By appropriately specifying the MA of the pad 115 or 125 in this way, the pad 115 or 125 may accommodate the solder layer 128s flowing due to the solder sweeping, and thus, bonding between the bump 128 and the pad 115 or 125 may be optimized to maximize a bonding force therebetween.

In the semiconductor package 100a, the TSVs 114 or 124 and the bumps 128 may have a second pitch Pi2. A width of each of the pads 115 or 125 may correspond to half the pitch of the TSVs 114 or 124, but is not limited thereto. As the MAs of the pads 115 or 125 vary, the pads 115 or 125 may not have a set pitch.

Referring to FIG. 7, an example of a semiconductor package 100b according to the inventive concept is similar to the semiconductor package 100a of FIG. 6, in terms of the MAs of the pads 115 or 125 in a peripheral region of a lower chip 110b or 120db being different from one another. In this example, the MAs of groups of the pads 115 or 125 may be different from each other.

For example, each of the pads 115 or 125 in a first group G1, in a center region of the lower chip 110b or 120db and each of the corresponding TSVs 114 or 124 may be aligned to each other in the first direction y, and have the same centerline C.CL. Thus, the MA of each of the pads 115 or 125 may be 0%.

The pads 115 or 125 in a second group G2 adjacent to the first group G1 may be respectively arranged as slightly offset in an outer direction (e.g., a direction from the center of a lower chip 110b or 120db toward a side edge thereof) with respect to the corresponding TSVs 114 or 124. For example, the MA of each of the pads 115 or 125 in the second group G2 may be 10 to 20%, but is not limited thereto.

The pads 115 or 125 in a third group G3 adjacent to the second group G2 may be more offset in the outer direction with respect to the corresponding TSVs 114 or 124 than are the pads 115 or 125 in the second group G2 relative to their corresponding TSVs 114 or 124. For example, the MA of each of the pads 115 or 125 in the third group G3 may be 30 to 50%, but is not limited thereto.

As the pads 115 or 125 are arranged in groups in the manner described above, a distance between the bump 128 and the pad 115 or 125 adjacent thereto in the outer direction may be different from group to group. For example, in the first group G1, the distance between the centerline C.CL of the bump 128 and an end of the pad 115 or 125 adjacent thereto in the outer direction may be a first distance S1. In the second group G2, the distance between a centerline G.CL1 of the bump 128 and an end of the pad 115 or 125 adjacent thereto in the outer direction may be a first group distance SG1. In the third group G3, the distance between a centerline G.CL2 of the bump 128 and an end of the pad 115 or 125 adjacent thereto in the outer direction may be a second group distance SG2. The first distance S1, the first group distance SG1, and the second group third distance S23 may increase in the foregoing order.

In the semiconductor package 100b, the TSVs 114 or 124 and the bumps 128 may have the same second pitch Pi2 in any region. A width of each of the pads 115 or 125 may correspond to half the pitch, e.g., half the second pitch Pi2, of the TSVs 114 or 125. As the MAs of the pads 115 or 125 are different from group to group, the pads 115 or 125 may not have a set pitch.

The pads 115 or 125 may be divided into three groups G1, G2, and G3, but the inventive concept is not limited thereto. For example, the pads 115 or 125 may be divided into two or four or more groups. The MAs of the pads 115 or 125 may vary in different ways among the groups.

Figure 8:
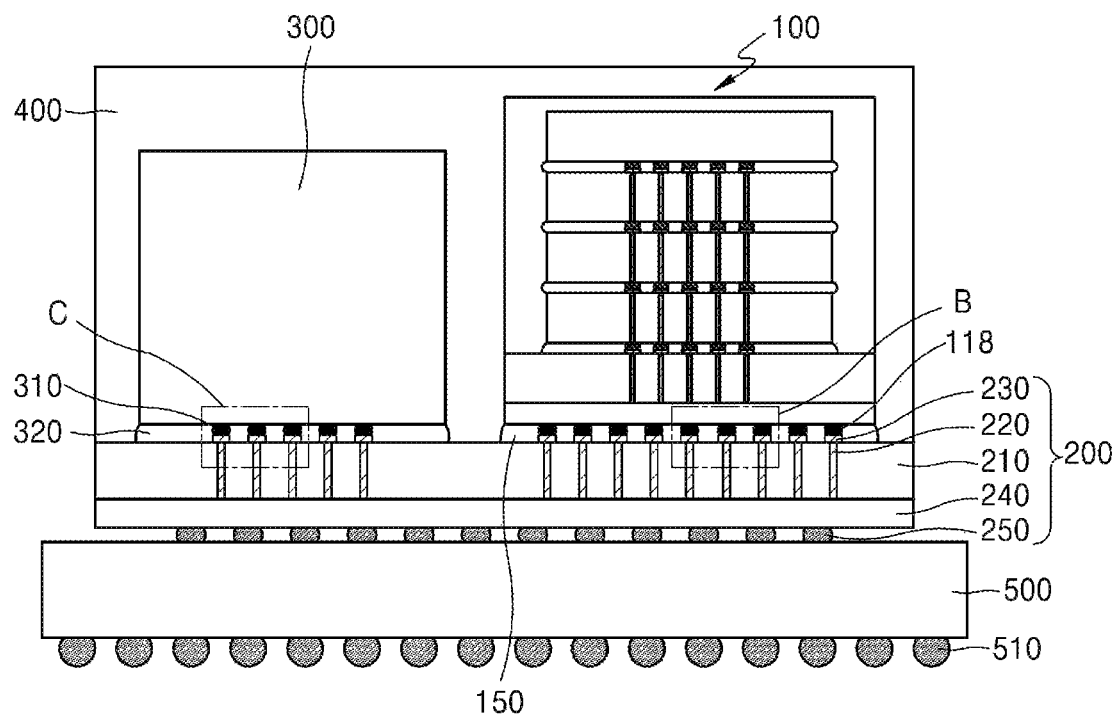
FIG. 8 is a cross-sectional view of a semiconductor device including the semiconductor package of FIG. 1, according the inventive concept.

FIG. 8 is a cross-sectional view of an example of a semiconductor package according to the inventive concept. The same elements as described with reference to FIGS. 1 to 7 will not be descried again or will only be briefly mentioned.

Referring to FIG. 8, a semiconductor device 1000 according to the inventive concept includes the semiconductor package 100, an interposer 200, a processor chip 300, an outer encapsulant 400, and a package substrate 500.

The semiconductor package 100 may have the same structure as described with reference to FIG. 1. Thus, in the semiconductor package 100, at least some pads 115 or 125 in the base chip 110 and the semiconductor chips 120-1~120-3 may be respectively offset from the centerlines of the corresponding TSVs 114 or 124 or the corresponding bumps 128. For example, the pads 115 or 125 in the peripheral region of the base chip 110 or the semiconductor chips 120-1~120-3 may be respectively shifted in the outer direction with respect to the corresponding TSVs 114 or 124 or the corresponding bumps 128.

In the semiconductor device 1000, the semiconductor package 100 is not limited to the semiconductor package 100 of FIG. 1. For example, the semiconductor packages 100a and 100b including the pad structure as shown in FIGS. 6 and 7 may be adopted by the semiconductor device 1000. The semiconductor package 100 in the semiconductor device 1000 may be, for example, an HBM package.

The interposer 200 includes a substrate 210, through via electrodes 220, pads 230, a wiring layer 240, and bumps 250. The semiconductor package 100 and the processor chip 300 may be mounted on the interposer 200 that is stacked on the package substrate 500. The interposer 200 may electrically connect the semiconductor package 100 and the processor chip 300 to the package substrate 500.

The substrate 210 may include a silicon substrate, an organic substrate, a plastic substrate, or a glass substrate, but is not limited thereto. In the case in which the substrate 210 is a silicon substrate, the interposer 200 is a silicon interposer. In the case in which the substrate 210 is an organic substrate, the interposer is a panel interposer.

The through via electrodes 220 may extend through the substrate 210 from an upper surface of the substrate 210 to a lower surface thereof. The through via electrodes 220 may extend into the wiring layer 240. In the case in which the substrate 210 is a silicon substrate, each of the through via electrodes 220 is a through silicon via (TSV).

The through via electrodes 220 may be the same as the TSVs 114 shown in FIG. 1. In some examples, the interposer 200 may include only the wiring layer 240 without through via electrodes.

The pads 230 may be disposed on the upper surface of the substrate 210 to be connected to the through via electrodes 220, respectively. The semiconductor package 100 and the processor chip 300 may be stacked on the pads 230 through the bumps 118 and 310. Centerlines of at least some pads 230 may be respectively offset from centerlines of the through via electrodes 220. For example, the pads 230 in a peripheral region of the semiconductor package 100 or the processor chip 300 may be arranged as shifted in the outer direction with respect to the corresponding through via electrodes 220. The pads 230 may include the same material as the pads 115 of the semiconductor package 100 of FIG. 1.

The wiring layer 240 may have a single or multi-layered wiring structure. The through via electrodes 220 may partly extend through the wiring layer 240 and be electrically connected to wirings of the wiring layer 240. When the wiring layer 240 is formed of two layers, the wirings at different layers may be connected to each other through a vertical contact.

The interposer 200 may serve to convert or transmit an input electrical signal between the package substrate 500 and the semiconductor package 100 or between the package substrate 500 and the processor chip 300. The interposer 200 does not include an active device or a passive device. In the interposer 200, the wiring layer 240 may be disposed below the through via electrodes 220. In some examples, the wiring layer 240 may be disposed over the through via electrodes 220.

The bumps 250 may be disposed on a lower surface of the interposer 200 and be connected to the wirings of the wiring layer 240. The bumps 250 may be used when the interposer 200 is stacked on the package substrate 500, such as a printed circuit board (PCB). The bumps 250 of the interposer 200 may be connected to the pads 230 through the wirings of the wiring layer 240 and the through via electrodes 220. The pads 230 used for power or ground may be connected together to one of the bumps 250. Thus, the number of the pads 230 may be greater than the number of the bumps 250.

The processor chip 300 may be a GPU, CPU, and/or SOC chip. The semiconductor device 1000 may be classified as a server semiconductor device or a mobile application semiconductor device depending on the type of the processor chip.

The outer encapsulant 400 may include, for example, an EMC. In some examples, the outer encapsulant 400 is formed together with the encapsulant 140 of the semiconductor package 100. The outer encapsulant 400 may cover sidewalls and upper surfaces of the semiconductor package 100 and the processor chip 300. In some examples, the outer encapsulant 400 covers the upper surface of the processor chip 300, but not the upper surface of the semiconductor package 100.

Outer connection terminals 510, such as solder balls, may be disposed below the package substrate 500. Thus, the semiconductor device 1000 may be mounted on another outer board through the outer connection terminals 510.

The semiconductor device 1000 may be deemed to have a 2.5D package structure. A 2.5D package structure denotes a difference in arrangement from a 3D package structure in which all semiconductor chips are stacked on one another and has no interposer. The semiconductor device 1000 according to inventive concept may thus be a system in package (SIP) having a 2.5D package structure.

Figure 9:
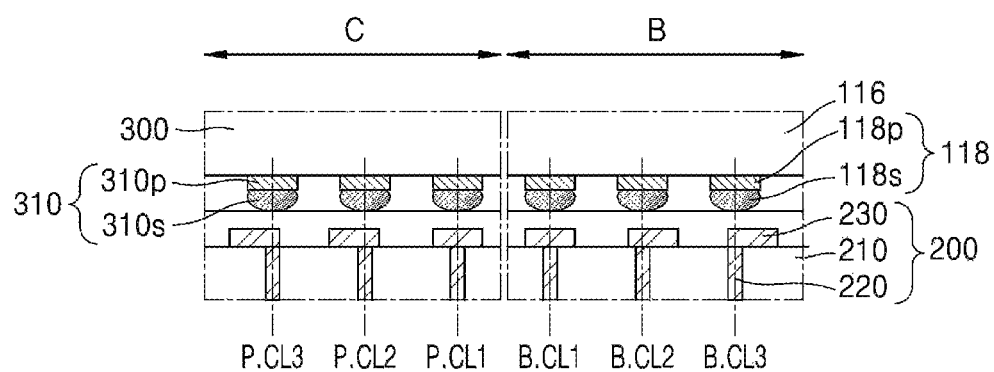
FIG. 9 is an enlarged view of portions in which a processor chip and a semiconductor package are stacked on an interposer in the semiconductor device of FIG. 8.

FIG. 9 is an enlarged view of regions C and B of the interface between the processor chip and the interposer and the interface between the semiconductor package and the interposer, respectively, in the semiconductor device of FIG. 8.

Referring to FIGS. 8 and 9, in the semiconductor device 1000, the interposer 200 may include the through via electrodes 220 similar to the TSVs 114 or 214 of the semiconductor package 100. The semiconductor package 100 and the processor chip 300 may be stacked on the interposer 200 using the bumps 118 and 310 and the adhesive layer 150 and 320 through the TCB method. At this time, the solder sweeping phenomenon may occur on the interposer 200. To effectively cope with the solder sweeping phenomenon, some of the pads 230 of the interposer 200 may be arranged as misaligned with (or shifted with respect to) the corresponding through via electrodes 220. Each of the bumps 118 on the lower surface of the base chip 110 may include the pillar 118$p$ and the solder layer 118$s$. Each of the bumps 310 on a lower surface of the processor chip 300 may include a pillar 310$p$ and a solder layer 310$s$.

More specifically, as shown in FIG. 8, the portion B includes a center region and a right peripheral region of the semiconductor package 100, and the portion C includes a center region and a left peripheral region of the processor chip 300. In the portion B in which the semiconductor package 100 is mounted on the interposer 200, the pads 230 in the peripheral region may be arranged as shifted to the right with respect to centerlines B.CL2 and B.CL3 of the through via electrodes 220. MAs of the pads 230 may increase in a right outer direction. For example, the MA of the pad 230 intersected by a centerline B.CL1 of the through via electrode 220 in a center region of the interposer 200 may be substantially 0%. The MA of the pad 230 intersected by a centerline B.CL2 of the right first through via electrode 220 may be 10 to 20%. The MA of the pad 230 intersected by a centerline B.CL3 of the right second through via electrode 220 may be 30 to 50%. However, the MAs of the pads 230 are not limited to these values.

In addition, in the portion C in which the processor chip 300 is mounted on the interposer 200, the pads 230 in the peripheral region may be arranged as shifted to the left with respect to centerlines P.CL2 and P.CL3 of the through via electrodes 220. MAs of the pads 230 may increase in a left outer direction. For example, the MA of the pad 230 intersected by a centerline P.CL1 of the through via electrode 220 in a center region of the interposer 200 may be substantially 0%. The MA of the pad 230 intersected by a centerline P.CL2 of the left first through via electrode 220 may be 10 to 20%. The MA of the pad 230 intersected by a centerline P.CL3 of the left second through via electrode 220 may be 30 to 50%. However, the MAs of the pads 230 are not limited to these values.

Similar to the semiconductor packages as described above with reference to FIGS. 4A-7, in the semiconductor device 1000, the pads 230 of the interposer 200 may be arranged as shifted in the outer direction of the semiconductor package 100 and/or the processor chip 300. Thus, when the semiconductor package 100 and/or the processor chip 300 is/are stacked on the interposer 200, despite the fluidity of the NCF and the solder sweeping caused thereby, the bumps 118 and 310 and the pads 230 may be solidly bonded, such that short circuits or contact failures may be prevented or minimized Therefore, the reliability of the semiconductor device 1000 may be enhanced.

The inventive concept may be applied to all types of semiconductor devices in which through via electrodes, such as TSVs that extend through a substrate, are present, pads are disposed on the through via electrodes, and a chip or the package is stacked using bumps including a solder layer and a fluidic adhesive layer, such as a NCF, through the TCB method.

Although the present inventive concept has been shown and described with reference to examples thereof, it will be understood by those of ordinary skill in the art that various changes in form and details may be made to such examples without departing from the spirit and scope of the present inventive concept as set forth by the following claims.

What is claimed is:

1. A semiconductor comprising:
   a lower chip including a lower chip body, first through silicon vias (TSVs) extending vertically through the lower chip body, and pads on an upper surface of the lower chip body, the pads being electrically connected to the first TSVs, respectively;
   an upper chip on the lower chip, the upper chip including an upper chip body, and bumps on a lower surface of the upper chip body, the bumps directly bonded to corresponding ones of the pads of the lower chip, respectively, and each of the bumps including a pillar and a solder layer; and
   an adhesive layer between the lower chip body and the upper chip body,
   wherein each of the pillars of the bumps, the first TSVs and the pads has a centerline extending in a direction perpendicular to the upper surface of the lower chip body, wherein the centerlines of the pillars of the bumps extend through geometric centers of the pillars, respectively, as viewed in a plan view of the semiconductor package, wherein the centerlines of the first TSVs extend through axial centers of the first TSVs, respectively, the centerlines of the pads extend vertically through geometric centers of the pads, respectively, as viewed in a plan view of the semiconductor package, wherein the centerlines of the pillars of the bumps are aligned with the centerlines of the first TSVs, respectively, in a peripheral region of the lower chip, the centerline of the pillar of a first bump from among the bumps is offset from the centerline of a corresponding pad from among the pads to which the first bump is bonded, and wherein a misaligned extent of each pad from among the pads is a distance between the centerline of a pillar of a bump from among the bumps bonded to the pad and the centerline of the pad, divided by a width of the pillar of the bump bonded to the pad, and the misaligned extent for each of the pads is less than 50%;

wherein in a central region of the lower chip, the centerline of the pillar of a second bump from among the bumps and the centerline of a corresponding pad from among the pads to which the second bump is bonded are aligned with each other, and wherein in the peripheral region of the lower chip, distances by which the centerlines of the pillars of a first plurality of bumps from among the bumps and the centerlines of a corresponding first plurality of pads from among the pads to which the first plurality of bumps are bonded are offset vary among the first plurality of bumps and the corresponding first plurality of pads bonded to each other.

2. The semiconductor package according to claim 1, wherein the pads are disposed symmetrically about a center of the lower chip, as viewed in a plan view of the semiconductor package.

3. The semiconductor package according to claim 1, wherein the solder layers of each of the bumps cover an upper surface of each of the pads.

4. The semiconductor package according to claim 1, wherein a diameter of each of the first TSVs is less than a width of each of the pads,
    in the central region of the lower chip, a first one of the pads is disposed symmetrically about the centerline of a first TSV from among the first TSVs electrically connected thereto, and
    in the peripheral region of the lower chip, a second one of the pads is disposed asymmetrically with respect to the centerline of a first TSV from among the first TSVs electrically connected thereto.

5. The semiconductor package according to claim 1, wherein the upper chip includes second TSVs extending vertically in the upper chip body, and
    wherein the second TSVs are electrically connected to the bumps, respectively.

6. The semiconductor package according to claim 5, wherein the second TSVs have centerlines extending through axial centers of the second TSVs, respectively, and the centerlines of the second TSVs are aligned with the centerlines of the pillars of the bumps, respectively.

7. The semiconductor package according to claim 1, wherein the lower chip is of a different type than the upper chip and has a different size than the upper chip.

8. The semiconductor package according to claim 1, wherein the semiconductor package is a high bandwidth memory (HBM) package.

9. The semiconductor package according to claim 1, wherein the adhesive layer is a non-conductive film (NCF) on a lower surface of the upper chip body and surrounding the bumps.

10. The semiconductor package according to claim 1, wherein the lower chip is a buffer chip and the upper chip is a memory chip.

11. The semiconductor package according to claim 10, further comprising a second memory chip on the upper chip,
    wherein the semiconductor package is a high bandwidth memory (HBM) package,
    the upper chip has second TSVs extending vertically through the upper chip body, and second pads disposed on the upper chip body and directly electrically connected to the second TSVs, respectively, and
    the second TSVs having centerlines extending through axial centers of the second TSVs, respectively,
    the second pads have centerlines extending vertically through geometric centers of the second pads, respectively, as viewed in a plan view of the semiconductor package,
    the centerlines of the second TSVs are aligned with the centerlines of the pillars of the bumps, respectively, and
    in a peripheral region of the memory chip, the centerline of each of the second TSVs is offset from the centerline of the second pad to which the second TSV is directly electrically connected.

12. A semiconductor device comprising the semiconductor package as claimed in claim 11, further comprising:
    a printed circuit board (PCB);
    an interposer mounted on the PCB, the semiconductor package being mounted on the interposer; and
    a processor chip mounted on the interposer as laterally spaced apart from the HBM package.

13. A semiconductor package comprising:
    a lower chip including a lower chip body, first through silicon vias (TSVs) extending vertically through the lower chip body, and pads on an upper surface of the lower chip body, the pads being electrically connected to the first TSVs, respectively;
    an upper chip on the lower chip, the upper chip including an upper chip body, and bumps on a lower surface of the upper chip body, the bumps directly bonded to corresponding ones of the pads of the lower chip, respectively, and each of the bumps including a pillar and a solder layer; and
    an adhesive layer between the lower chip body and the upper chip body,
    wherein each of the pillars of the bumps, the first TSVs and the pads has a centerline extending in a direction perpendicular to the upper surface of the lower chip body,
    wherein the centerlines of the pillars of the bumps extend through geometric centers of the pillars, respectively, as viewed in a plan view of the semiconductor package,
    wherein the centerlines of the first TSVs extend through axial centers of the first TSVs, respectively, wherein the centerlines of the pads extend vertically through geometric centers of the pads, respectively, as viewed in a plan view of the semiconductor package,
    wherein the centerlines of the pillars of the bumps are aligned with the centerlines of the first TSVs, respectively, in a peripheral region of the lower chip, the centerline of the pillar of a first bump from among the bumps is offset from the centerline of a corresponding first pad from among the pads to which the first bump is bonded, wherein a misaligned extent of each pad from among the pads is a distance between the centerline of a pillar of a bump from among the bumps bonded to the pad and the centerline of the pad, divided by a width of the pillar of the bump bonded to the pad, and the misaligned extent for each of the pads is less than 50%, wherein in a central region of the lower chip, the centerline of the pillar of a second bump from among the bumps and the centerline of a corresponding pad from among the pads to which the second bump is bonded are aligned with each other, and wherein in the peripheral region at one side of a center of the lower chip distances by which the centerlines of the pillars of a first plurality of bumps from among the bumps and the centerlines of a corresponding first plurality of pads from among the pads to which the first plurality of bumps are bonded increases as distance from the centerlines of the pillars of each of first plurality of bumps to the central region of the substrate increases.

14. The semiconductor package according to claim 13, wherein the pads are disposed symmetrically about the center of the lower chip, as viewed in a plan view of the semiconductor package.

15. A semiconductor package or device comprising:
a substrate having a substrate body, through-vias extending vertically through the substrate body, and pads on an upper surface of the substrate body, the pads being disposed on and electrically connected to the through-vias, respectively;
a chip comprising an integrated circuit on the substrate, the chip including a chip body, and bumps on a lower surface of the chip body, the bumps electrically connected to the integrated circuit and directly bonded to corresponding ones of the pads, respectively, and each of the bumps including a pillar and a solder layer; and
an adhesive layer between the substrate body and the chip body,
wherein each of the pillars of the bumps, the pads and the through-vias has a centerline extending in a direction perpendicular to the upper surface of the substrate body,
wherein the centerlines of the pillars of the bumps extend through geometric centers of the pillars, respectively, as viewed in a plan view of the semiconductor package or device,
wherein the centerlines of the pads extend vertically through geometric centers of the pads, respectively, as viewed in a plan view of the semiconductor package,
wherein the centerlines of the through-vias coincide with axial centers of the through-vias, respectively,
wherein the centerlines of the pillars of the bumps are aligned with the centerlines of the through-vias, respectively, wherein a misaligned extent of each pad from among the pads is a distance between the centerline of a pillar of a bump from among the bumps bonded to the pad and the centerline of the pad, divided by a width of the pillar of the bump bonded to the pad, and the misaligned extent for each of the pads is less than 50%;

wherein in a central region of the lower chip, a first pad from among the pads is symmetrical with respect to the centerline of the first through-via on which the first pad is disposed, wherein for each pad from among the pads in a peripheral region of the substrate at one side of a central region of the substrate, one part of the pad closer to a peripheral edge of the substrate than the centerline of the through-via on which the pad is disposed has a surface area greater than a surface area of a remainder of the pad closer to the central region of the substrate than the centerline of the through-via on which the pad is disposed, the one part of the pad and the remainder of the pad than the centerline of the through-via on which the pad is disposed being on opposite sides of the centerline of the through-via on which the pad is disposed, along an outer direction extending from the central region of the substrate to the peripheral edge of the substrate, such that the pad is asymmetrical with respect to the centerline of the through-via on which the pad is disposed, and wherein for the pads in the peripheral region of the substrate at the one side of the central region of the substrate, the surface areas of the parts of the pads closer to the peripheral edge of the substrate are greater as distance from the centerline of the through-via on which the pad is disposed to central region of the substrate increases.

16. The semiconductor package or device according to claim 15, wherein the substrate constitutes a lower chip having an integrated circuit, and the through-vias are through silicon vias (TSVs) to which the integrated circuit of the lower chip is electrically connected.

17. The semiconductor package or device according to claim 16, further comprising a printed circuit board, wherein the substrate constitutes an interposer interposed between the chip and the printed circuit board and electrically connecting the bumps of the chip to the printed circuit board, whereby the interposer also electrically connects the integrated circuit of the chip to the printed circuit board.

18. The semiconductor package or device according to claim 15, further comprising an encapsulant covering the chip and portions of the upper surface of the substrate exposed by the chip.

* * * * *